(12) United States Patent
Bailey

(10) Patent No.: US 8,072,252 B2
(45) Date of Patent: Dec. 6, 2011

(54) COMPOUND LOGIC FLIP-FLOP HAVING A PLURALITY OF INPUT STAGES

(75) Inventor: Daniel W. Bailey, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 17 days.

(21) Appl. No.: 12/171,838

(22) Filed: Jul. 11, 2008

(65) Prior Publication Data
US 2010/0007396 A1    Jan. 14, 2010

(51) Int. Cl.
*H03K 3/356* (2006.01)
(52) U.S. Cl. ......... 327/210; 327/199; 327/200; 327/211
(58) Field of Classification Search .......... 327/161, 327/185, 199–203, 208–212, 214, 218
See application file for complete search history.

(56) References Cited

U.S. PATENT DOCUMENTS

| | | | |
|---|---|---|---|
| 6,239,640 B1 * | 5/2001 | Liao et al. | 327/218 |
| 6,359,828 B1 * | 3/2002 | La | 365/230.06 |
| 6,417,711 B2 * | 7/2002 | Fulkerson | 327/203 |
| 6,437,625 B1 * | 8/2002 | Kojima et al. | 327/218 |
| 7,301,373 B1 * | 11/2007 | Bailey et al. | 327/55 |
| 7,492,202 B2 | 2/2009 | Inoue | |
| 2006/0170464 A1 * | 8/2006 | Muller | 327/117 |

* cited by examiner

*Primary Examiner* — Lincoln Donovan
*Assistant Examiner* — Brandon S Cole
(74) *Attorney, Agent, or Firm* — Meyertons, Hood, Kivlin, Kowert & Goetzel, P.C.; Erik A. Heter

(57) ABSTRACT

A compound logic flip-flop. The flip-flop includes a plurality of input stages, wherein each of the input stages is coupled to receive at least one input signal and a clock signal. Each of the plurality of input (i.e. 'master') stages is configured to perform a corresponding input logic function during a first phase of a clock cycle and to store a result of the corresponding input logic function. The flip-flop further includes an output (i.e. 'slave') stage coupled to receive the clock signal and the results of the input logic functions from each of the plurality of input stages. The output stage is configured, during a second phase of the clock cycle, to logically combine the results of the input logic functions by performing an output logic function and provide an output signal based on a result of the output logic function.

20 Claims, 4 Drawing Sheets

# COMPOUND LOGIC FLIP-FLOP HAVING A PLURALITY OF INPUT STAGES

BACKGROUND OF THE INVENTION

1. Field of the Invention

This invention relates to digital circuits, and more particularly, to circuits that include combinational logic and flip-flops.

2. Description of the Related Art

Logic circuits are very well known in the art of electronics. Logic circuits can be divided into two main categories, combinational logic circuits and sequential logic circuits.

Combinational logic circuits include various types of common logic gates, such as AND, OR, NAND, and NOR gates. A combinational logic circuit can be a simple logic circuit having only a single gate, or can be a complex logic circuit having hundreds of gates arranged in various levels. Combinational logic circuits can be used to perform various functions such as addition, a bitwise AND or OR operation of two different operands, and so forth.

Sequential logic circuits include a wide variety of circuits whose operations depend not only on a present state of the inputs but a past state as well. One of the most common sequential circuits is the flip-flop. FIG. 1 is a logic diagram illustrating a common edge-triggered D-type flip-flop having a master-slave configuration. Data is latched into the master portion of the flip-flop during the low portion of the clock ('clk') signal, with the data received on the D input propagating to the NAND gate output labeled D'. When the clock goes high, the data from D' propagates to the output Q. Thus, the D-type flip-flop shown is considered to be a positive edge triggered flip-flop, as the output changes (in accordance with the data input D) on the positive-going edge of the clock signal. Many other types of flip-flops (J-K, SR, T, etc.) are also well known in the art.

In many digital systems, the results of combinational logic operations must be propagated in a synchronous manner. This can be accomplished by coupling an output(s) of the combinational logic function to the input of a flip-flop, such as the D-type flip-flop discussed above. The result of the combinational logic function can then be conveyed by the flip-flop in a manner that is synchronous with a clock signal.

SUMMARY OF THE INVENTION

A compound logic flip-flop is disclosed. In one embodiment, the flip-flop includes a plurality of input stages, wherein each of the input stages is coupled to receive at least an input signal and a clock signal. Each of the plurality of input (i.e. 'master') stages is configured to perform a corresponding input logic function during a first phase of a clock cycle and to store a result of the corresponding input logic function. The flip-flop further includes an output (i.e. 'slave') stage coupled to receive the clock signal and the results of the input logic functions from each of the plurality of input stages. The output stage is configured, during a second phase of the clock cycle, to logically combine the results of the input logic functions by performing an output logic function and provide an output signal based on a result of the output logic function.

A method for operating a compound logic flip-flop includes performing a plurality of logic functions for each of a corresponding group of input signals, wherein each of the plurality of logic functions is performed for its corresponding group of input signals in a corresponding one of a plurality of input stages, and storing the results of each of the plurality of logic functions in a corresponding storage circuit in its corresponding one of the plurality of input stages. The method further includes latching the results of each of the plurality of logic functions from the plurality of input stages to an output flip-flop stage and logically combining the results of each of the plurality of logic functions in the output flip-flop stage to produce an output signal. The method is performed in accordance with a clock signal having a first phase and a second phase, wherein the latching and logically combining are performed during the second phase.

In another embodiment, a compound logic flip-flop includes first means for performing a plurality of logic functions on corresponding groups of input signals during a first phase of a clock cycle and second means for storing results obtained from said performing a plurality of logic functions. The compound logic flip-flop further includes third means for logically combining, during a second phase of the clock cycle, the results of the plurality of logic functions to produce an output signal and fourth means for latching the results of the plurality of logic functions from said second means to said third means.

Various types of logic functions may be implemented in the master stages and the slave stage of the compound logic flip-flop. For example, in one embodiment, the two master stages each incorporate 2-input NAND gates, while the slave stage incorporates a 2-input NOR gate, resulting in a flip-flop equivalent to a 4-input AND flip-flop. In another exemplary embodiment, a first master stage may incorporate a 3-input NAND gate, a second master stage may incorporate a 4-input AND gate, and a third master stage may incorporate a 2-input exclusive OR (XOR) gate. A slave stage of such a flip-flop could incorporate a 3-input NOR gate.

Results of the logic functions performed in the master stages may be stored in corresponding storage circuits. The storage circuits may be any suitable type of circuitry used for storing a logic value. Examples include back-to-back inverter configurations, cross-coupled transistor configurations, and cross-coupled NAND gates that may be found in a typical master-slave flip-flop configuration. The storage circuits are implemented in the master stages and slave stage. The storage circuits implemented in the master stages may perform their respective capture and storage operations during the first phase of a clock cycle, or a second phase of the clock cycle, depending on the circuit configuration.

BRIEF DESCRIPTION OF THE DRAWINGS

Other aspects of the invention will become apparent upon reading the following detailed description and upon reference to the accompanying drawings in which.

Figure 1:
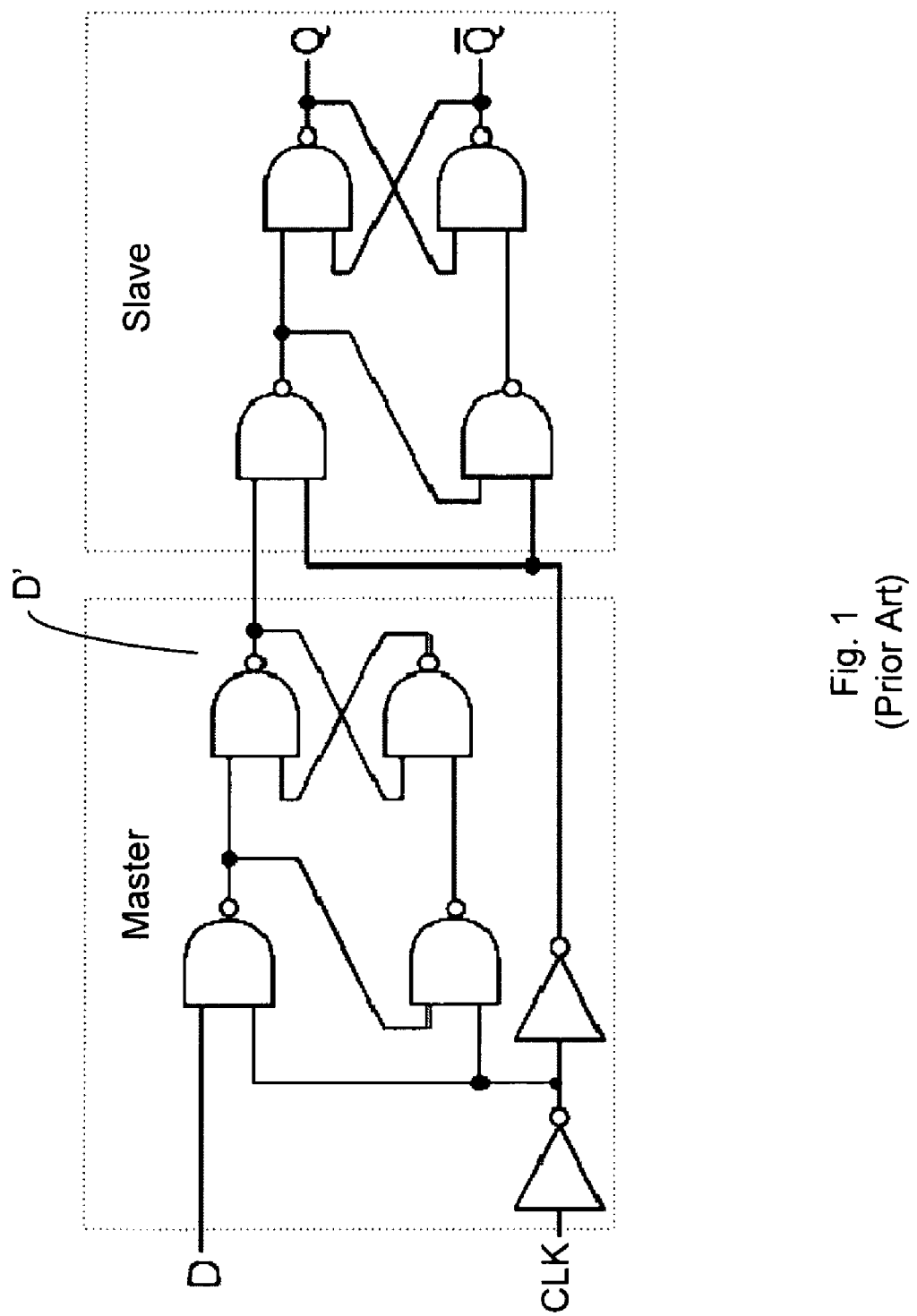
FIG. 1 (Prior Art) is a circuit diagram of one embodiment of a master-slave flip-flop.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
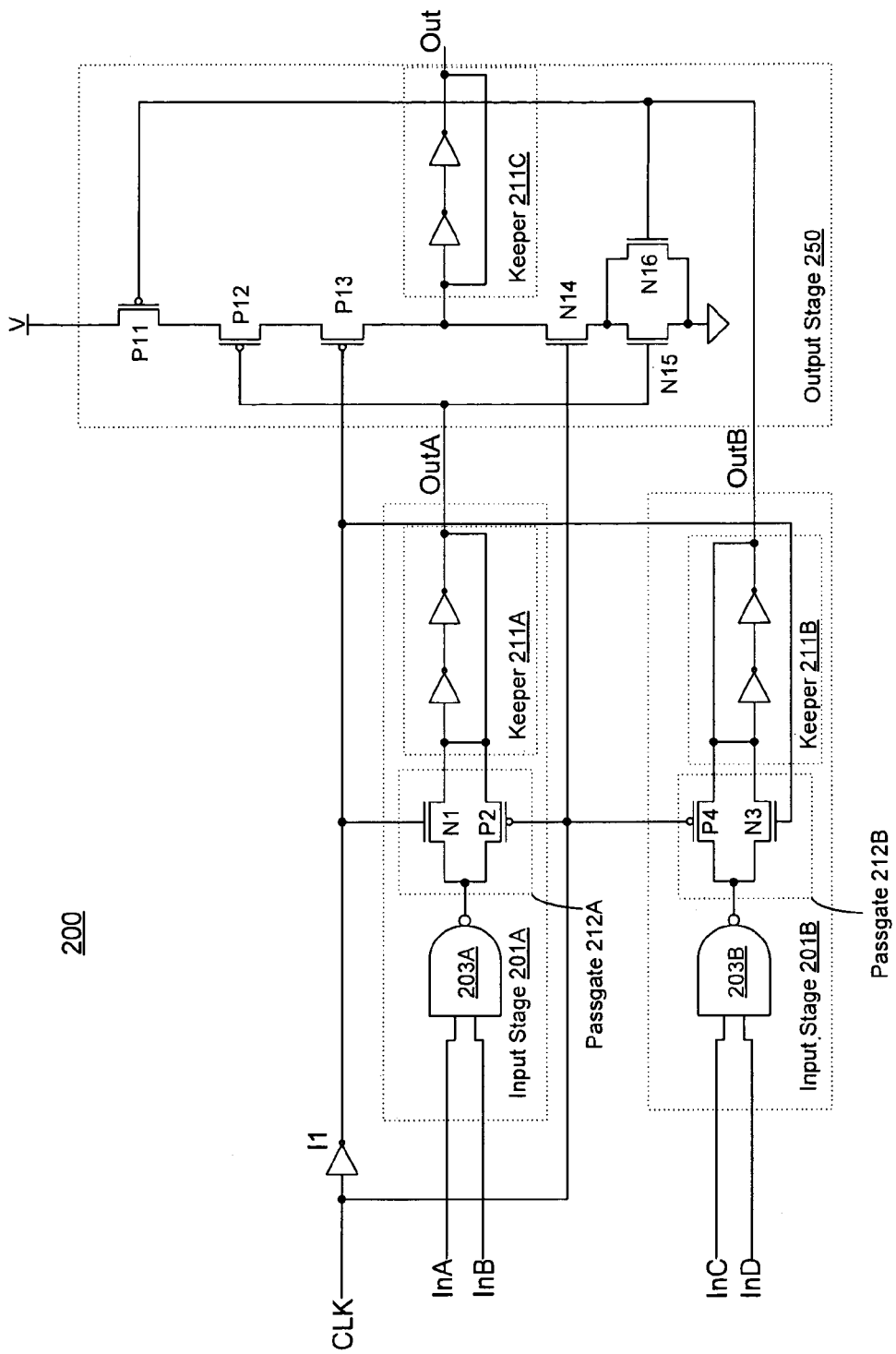
FIG. 2 is a circuit diagram of one embodiment of a compound logic flip-flop having a plurality of input (master) stages and an output (slave) stage.

Turning now to FIG. 2, a circuit diagram of one embodiment of a compound logic flip-flop having a plurality of input (master) stages and an output (slave) stage is shown. Alternatively viewed, flip-flop 200 as shown in FIG. 1 can be considered to have a first stage comprising a plurality of input stages.

In the embodiment shown, flip-flop 200 is a compound logic flip-flop that includes two input (i.e. master) stages, 201A and 201B, and one output (i.e. slave) stage, 250. Each of input stages 201A and 201B incorporate a two-input NAND gate (203A and 203B, respectively). A passgate 212A couples the output of NAND gate 203A to a keeper 211A, while a passgate 212B couples the output of NAND gate 203B to keeper 211B. Passgates 212A and 212B include NMOS transistors N1 and N3, respectively, and also include PMOS transistors, P2 and P4 respectively.

Flip-flop 200 is coupled to receive a clock signal on the input labeled 'CLK'. The clock signal is provided directly to transistors P2 and P4 of passgates 212A and 212B, respectively, as well as to NMOS transistor N15 of output stage 250. A complement of the clock signal is provided, via the output of inverter I1, to transistors N1 and N3 of passgates 212A and 212B, respectively, as well as to transistor P13.

Output stage 250 serves as a slave stage of the multiple master/single slave configuration in this embodiment. In the embodiment shown, output stage 250 includes a fully tri-stateable NOR gate and keeper 211C. Output stage 250 is enabled when transistors P13 and N15 are turned on. When both of these transistors are turned off, the fully tri-stateable NOR gate is in a high-impedance state, and the slave keeper 211C holds the flip-flop output state.

Operation of the embodiment shown in FIG. 2 is described as follows. During a first phase of a clock cycle, the clock signal is low. Transistors P2 and P4 receive the low input on their respective gate terminals, and are thus activated. Inverter I1 also receives the low on its input, and thus provides a high on its output. The high output from inverter I1 is propagated to the respective gate terminals of transistors N1 and N3, thereby causing their activation. Thus, both passgates 212A and 212B are turned on during the first (low) phase of the clock cycle in this embodiment. During the low phase of the clock cycle, outputs from NAND gates 203A and 203B are transparent to keepers 211A and 211B, respectively. Accordingly, during the first phase of the clock cycle, a first NAND function can be performed on inputs InA and InB and a second NAND function can be performed on inputs InC and InD, with the results thereof captured by keepers 211A and 211B, respectively. When the first phase of the clock cycle ends, the clock signal transitions high, thereby causing both passgates 212A and 212B to turn off. The logic output values provided by NAND gates 203A and 203B are held by keepers 211A and 211B, respectively, even after the passgates are turned off.

During the second (high) phase of the clock cycle, the output of inverter I1 falls low. Transistor P13 is thus turned on as a result of the low coupled to its gate terminal. Transistor N14 is also concurrently activated as a result of the high clock signal that is coupled directly to its gate. Since both transistors P13 and N13 are turned on, output stage 250 is enabled. Output stage 250 provides a NOR function, and thus the level of the output signal provided therefrom depends accordingly.

If both OutA (from keeper 211A) and OutB (from keeper 211B) are low, transistors P12 and P11 are activated, respectively, in accordance with the low level on their respective gate terminals. The activation of transistors P12 and P11 thus causes the output signal 'Out' to be pulled high. If either or both of OutA or OutB is a logic high, the output signal 'Out' is pulled low. A high value for OutA results in the activation of transistor N15 due to the high on its gate terminal, thereby allowing 'Out' to be pulled low through N15. A high value for OutB results in the activation of transistor N16 due to the high on its gate terminal, thereby allowing 'Out' to be pulled low through N16. Accordingly, the output signal 'Out' is a logic high or logic low depending upon a NOR function performed on the captured output states of NAND gates 203A and 203B.

Therefore, the circuit of FIG. 2 incorporates logic functions in the multiple master stages and the slave stage in a compound logic flip-flop. Such a circuit provides an alternative to an arrangement in which a two NAND gates have outputs coupled to the inputs of a 2-input NOR gate, which is equivalent in function to a 4-input AND gate, and which in turn has an output coupled to a flip-flop such as a D-type flip flop. Incorporating the logic functions into the flip-flop stages may eliminate some of the propagation delays associated with the previous arrangement wherein the output of a combinational logic circuit is provided to a conventional flip-flop. The elimination of such propagation delays can result in faster circuit operation. The ability to incorporate logic functions into flip-flop stages as discussed herein also allows for an arrangement wherein multiple master stages are coupled to a slave stage.

Figure 3:
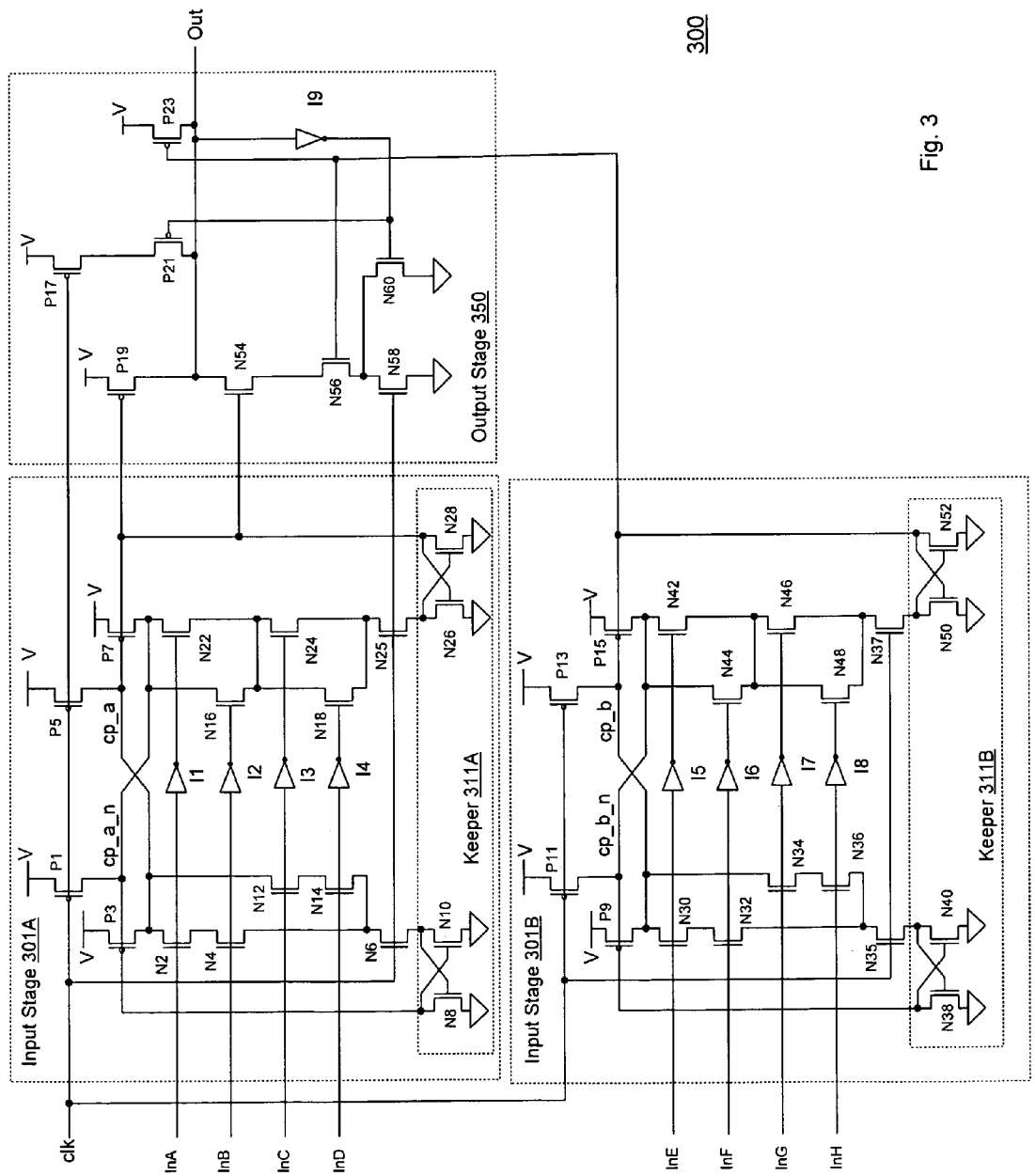
FIG. 3 is a circuit diagram of another embodiment of a compound logic flip-flop having a plurality of input (master) stages and an output (slave) stage.

FIG. 3 is a circuit diagram of another embodiment of a compound logic flip-flop having a plurality of input (master) stages and an output (slave) stage. In the embodiment shown, flip-flop 300 includes two input stages 301A and 301B, and an output stage 350. Each of input stages 301A and 301B implement a four input AOI (AND-OR-Invert) function. Output stage 350 is coupled to receive the logical results from input stages 301A and 301B, and is configured to perform a NAND function on these results. This compound function is equivalent to an 8-input AOI flip-flop, which is a convenient means to implement a 4-input multiplexor flip-flop if the 4 selects are exclusive, that is, if the select signals are paired with the data lines, and only one select signal is asserted high.

Each of input stages 301A and 301B are configured to receive four separate inputs upon which their respective logic functions are performed. Input stage 301A is configured to perform an AOI function on logic signals received via inputs InA-InD. Input stage 301B is configured to perform an AOI function on logic signals receive via inputs InE-InH. The results of the logic functions of input stages 301A and 301B are stored in keepers 311A and 311B, respectively. Keepers 311A and 311B are each configured to store both true and complementary logic values of their respective AOI functions. Due to the particular circuit configuration, the storage of these logic values occurs during the second (high) phase of the clock cycle.

In the circuit of FIG. 3, a first phase of the clock cycle occurs when the clock is low. A precharge operation is performed on both input stages 301A and 301B during the first phase of the clock cycle. Transistors P1 and P5 of input stage 301A are active during the first phase of the clock cycle, as are transistors P11 and P13 of input stage 301B. When transistors P1 and P5 are active, node cp_a and its complementary node, cp_a_n, are pulled up to voltage V. Likewise, nodes cp_b and cp_b_n are also pulled up to voltage V through transistors P11 and P13. Transistor P17 of output stage 350 is also active during the low portion of the clock cycle, and will pull up the output node to V if transistor P21 is also active (which depends on the previous state of the output node 'Out').

Precharging node cp_a results in transistor N26 of keeper 311A being active, which in turn, results in transistor N28 being inactive. The precharge of node cp_a_n results in the activation of transistor N10, thereby ensuring transistor N8 is inactive. This circuit operation is the same as that as occurs in keeper 311B, wherein the precharging of node cp_b activates transistor N50 and ensures transistor N52 is inactive, while the precharging of node cp_b_n activates transistor N40 while ensuring transistor N38 is inactive.

When the clock signal transitions high (i.e., to the second phase of the clock cycle), one of the precharged nodes in each of input stages 301A and 301B is discharged, depending on the state of the logic inputs. In input stage 301, AND operations are performed on InA and InB (InA AND InB) and are also performed on InC and InD (InC AND InD). The results of these two AND operations are then OR'd together ((InA AND InB) OR (InC AND InD)), and the complementary result of this operation appears on node cp_a (i.e. the result is inverted).

An example of one particular combination of logic inputs is in order. If InA AND InB results in a true logic value ((InA=InB=1), transistors N2 and N4 will both be active. Transistors N22 and N16 are consequently inactive because of inverters I1 and I2, respectively. Transistors N6 and N25 are activated as a result of the clock signal being high. Node cp_a will thus discharge to ground through transistors N2, N4, N6, and N10, the latter of which was active due to the pre-charge of cp_a_n. When cp_a discharges to ground, transistor P7 is turned on and both transistors N16 and N22 are turned off, thereby ensuring cp_a_n remains pulled up to voltage V. A low value on node cp_a also turns off transistor N26. When N26 is turned off, the gate terminal of N28 may be charged (or pulled) high, thereby resulting in the activation of N28. The activation of N28 in this particular example ensures that cp_a is pulled down if the signals InA or InB changes after the clock has risen. Furthermore, the activation and deactivation of transistors in input stage 301A that results from the discharge of cp_a thereby causes the result of the AOI logic function to be captured on the rising edge of clock and stored therein.

Generally speaking, after the clock transitions high (i.e. to the second phase of the clock cycles), one of the nodes cp_a or cp_a_n of input stage 301A will be discharged, thereby causing the result of the AOI function to be captured into input stage 301A. Input stage 301B has an identical configuration to input stage 301B, and thus, one of cp_b or cp_b_n is discharged after the clock transitions high, causing the result of its respective AOI function to be captured into input stage 301B.

The results of the AOI functions performed in input stages 301A and 301B are conveyed to output stage 305 via nodes cp_a and cp_b, respectively. Node cp_a is coupled to the respective gate terminals of transistors P19 and N54 of output stage 350, while node cp_b is coupled to the respective gate terminals of transistors P23 and N56. The respective gate terminals of transistors P17 and N58 are coupled to receive the clock signal.

Output stage 350 is configured as a NAND gate that is half-tristated and as a feedback circuit that holds its state when the clock is low. If either of cp_a or cp_b is low, the output node 'Out' will be pulled high. If cp_a is low, 'Out' is pulled high through P19, which is activated due to the low on its gate terminal. If cp_b is low, 'Out' is pulled high through P23, which is activated due to the low on its gate terminal. If both cp_a and cp_b are low, 'Out' is pulled high through both P19 and P23. If both cp_a and cp_b are high, transistors N54 and N56 are activated, and 'Out' is pulled low through N54, N56, and N58. The low signal on 'Out' will also result in transistor N60 being activated (via the high output of I9), thereby creating an additional pulldown path.

As previously noted, output stage 350 is a half-tristate NAND gate and a feedback circuit that holds its state when the clock is low. During the first phase of a given clock cycle, the signal on 'Out' is that of the previous clock cycle. For example if 'Out' was high as a result of the previous clock cycle, it will remain high through the first phase of the present clock cycle, being pulled up through P17 and P21, while transistors N58 and N60 are off. If 'Out' was low as a result of the previous clock signal, 'Out' will continue to be pulled low during the present clock cycle through N54, N56 (both of which are activated due to the precharging of cp_a and cp_b, respectively) and N60. Only after the clock signal transitions high (turning off P17 and turning on N58) can the state of 'Out' change in accordance with the present clock cycle for this particular configuration. In other words, the half-tristate NAND in output stage 350 is enabled only for the high phase of a given clock cycle, and is latched during the low phase of the clock cycle.

Figure 4:
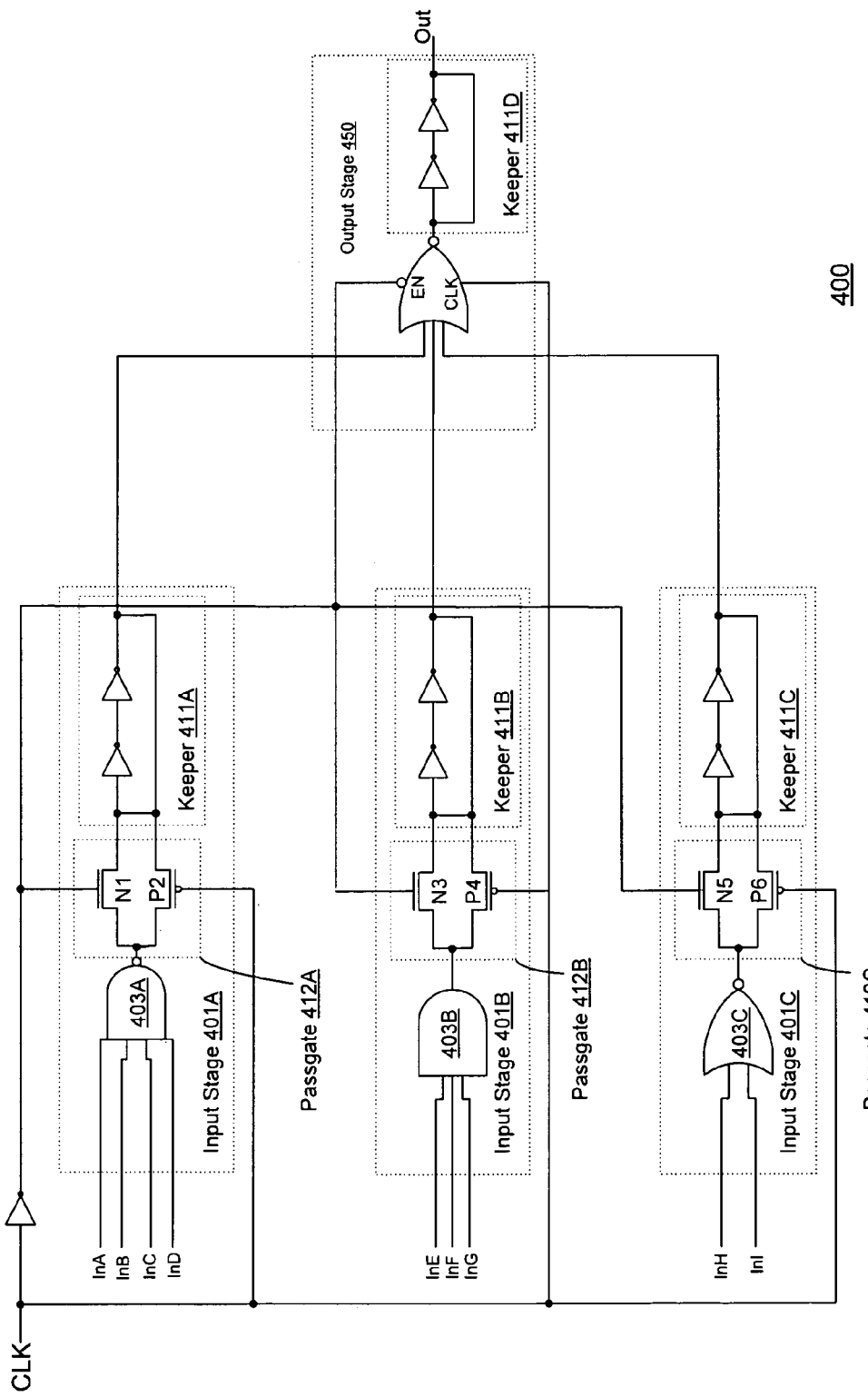
FIG. 4 is a circuit diagram of another embodiment of a compound logic flip-flop having differing logic functions among the plurality of input stages.

Turning now to FIG. 4, a circuit diagram of another embodiment of a compound logic flip-flop having differing logic functions among the plurality of input stages. In this particular embodiment, flip-flop 400 includes input stages 401A, 401B, and 401C. Each of these input stages implements a different logic function with respect to other ones of the input stages, and each has a different number of inputs. Input stage 401A implements a 4-input NAND function (NAND gate 403A), input stage 401B implements a 3-input AND function (AND gate 403B), and input stage 401C implements a 2-input NOR function (NOR gate 403C).

In general, a flip-flop in accordance with the present disclosure may be implemented with as many input stages as is practical. The logic functions implemented in each input stage may be different with respect to that implemented in the other input stages, or may be the same with respect to that implemented in one or more of the other input stages. For example, an alternate embodiment having 2 4-input NAND gates and a 3-input OR gate would be possible in accordance with the present disclosure.

In the embodiment shown, each of the logic functions of input stages 401A-401C is coupled to a respective keeper 411A-411C via a respective passgate 412A-412C. Passgates 412A-412C are transparent when active, and thus allow the output of their respectively coupled logic functions to propagate to their corresponding one of keepers 411A-411C. The circuits are designed such that the output signals provided by each of the logic gates overpower the keepers when the passgates are active (during the low portion of the clock cycle). When the clock signal transitions high, the passgates are de-activated, and each of the keepers captures and holds the logic value received from its respective gate during the low portion of the clock. In general, flip-flops in accordance with this disclosure may be designed such that the logic outputs are transparent to the keepers during either the first (low) or second (high) stages of the clock cycle. Furthermore, the keepers associated with each input stage may be any type of circuitry capable of storing a logic value, including any of the various types shown herein. Such keepers are configured to store both the true logic value and its complement.

Output stage 450 of FIG. 4 includes a fully tri-stateable 3-input NOR gate. This NOR gate is enabled during the high portion (second phase) of the clock cycle. During the low portion (first phase) of the clock cycle, the output of the fully tri-stateable NOR gate of output stage 450 is in a high impedance state. However, as noted in FIG. 3, embodiments utilizing a half-tristate circuit configuration are also possible and contemplated for use with output stages. Furthermore, embodiments are possible and contemplated wherein the output stage does not have a tri-state configuration. In the embodiment shown, output stage 450 also includes a keeper 411D, which captures and holds the output value provided when the NOR gate is disabled.

The examples presented herein represent a small number of possible embodiments of the compound logic flip-flop disclosed herein. A wide variety of different implementations are possible and contemplated within the scope of this disclosure. In general, a compound logic flip-flop in accordance with the disclosure herein includes a plurality of input stages and an output stage, wherein each of the input stages and the output stage implements a logic function. The relationship of each input stage to the output stage is that of a master-slave flip-flop configuration, wherein inputs are applied during a first phase of a clock cycle and an output is provided by the flip-flop in a second phase of the clock cycle. The results of the logic functions performed by each of the input stages may be captured and stored in a keeper, and conveyed therefrom to the output stage where the output logic function is performed. The logic function of a given stage, input or output, may include one or more of any of the various types of known logic functions (e.g., AND, OR, NAND, NOR, invert etc.). The number of inputs and the logic functions among the plurality of input stages may vary in some embodiments, or may be the same in other embodiments. Furthermore, the number of inputs to any given stage, input or output, is not theoretically limited, although there may be practical limits in some cases.

The compound logic function in accordance with the present disclosure may provide speed advantages in the larger circuit in which it is implemented. Such a compound logic flip-flop may eliminate one or more gate delays relative to a configuration wherein a plurality of logic functions are performed in a first level with their output logically combined in a second level, wherein the output of the second level is subsequently provided to a flip-flop.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A flip-flop comprising:
a plurality of input stages, wherein each of the input stages is coupled to receive a clock signal and two or more logically independent input signals, wherein each of the plurality of input stages is configured to perform a corresponding input logic function and to store a result of the corresponding input logic function, wherein each of the plurality of input stages includes first and second precharge circuits configured to precharge a first node and a second node, respectively, during a first phase of a clock signal, and wherein each of plurality of input stages is configured to discharge one of the first or second nodes during a second phase of the clock signal responsive to performing the corresponding input logic function; and
an output stage, wherein the output stage is coupled to receive the clock signal and the results of the input logic functions from each of the plurality of input stages and configured to, during the second phase of the clock cycle, logically combine the results of the input logic functions by performing an output logic function and provide an output signal based on a result of the output logic function.

2. The flip-flop as recited in claim 1, wherein the flip-flop is in a master-slave configuration, wherein each of the plurality of input stages is a master stage, and wherein the output stage is a slave stage.

3. The flip-flop as recited in claim 1, wherein each of the plurality of input stages is configured to perform a logic function that is identical to a logic function performed in the other ones of the plurality of input stages.

4. The flip-flop as recited in claim 1, wherein at least one of the plurality of input stages is configured to perform a logic function that is different with respect to a logic function of one of the other ones of the plurality of input stages.

5. The flip-flop as recited in claim 1, wherein the clock signal is a logic low during the first phase of the clock signal and a logic high during the second phase of the clock signal.

6. The flip-flop as recited in claim 1, wherein the clock signal is a logic high during the first phase of the clock signal and a logic low during the second phase of the clock signal.

7. The flip-flop as recited in claim 1, wherein each of the plurality of input stages includes a keeper circuit configured to store the result of its corresponding logic function.

8. The flip-flop as recited in claim 1, wherein the output logic function includes one or more of the following functions: AND, OR, NAND, NOR, XOR, XNOR, Invert, non-inverting buffer.

9. The flip-flop as recited in claim 1, wherein the corresponding input logic function for a particular one of the plurality of input stages includes one or more of the following functions: AND, OR, NAND, NOR, XOR, XNOR, Invert, non inverting buffer.

10. A method comprising:
precharging a first node and a second node of each of a plurality of input stages of a flip-flop circuit during a first phase of a clock signal having the first phase and a second phase;
performing a plurality of logic functions for each of a plurality of groups of input signals in corresponding ones of the plurality of input stages, wherein at least one of the plurality of input stages is coupled to receive two or more logically independent input signals, and wherein performing the plurality of logic functions includes discharging one of the first and second nodes in each of the plurality of input stages during the second phase of the clock signal;
storing the results of each of the plurality of logic functions in a corresponding storage circuit in its corresponding one of the plurality of input stages;
latching the results of each of the plurality of logic functions from the plurality of input stages to an output stage; and
logically combining the results of each of the plurality of logic functions in the output stage to produce an output signal.

11. The method as recited in claim 10, wherein each of the plurality of logic functions is identical.

12. The method as recited in claim 10, wherein at least one of the plurality of logic functions is different with respect to other ones of the plurality of logic functions.

13. The method as recited in claim 10, wherein the clock signal is a logic low during the first phase of the clock signal and a logic high during the second phase of the clock signal.

14. The method as recited in claim 10, wherein the clock signal is a logic high during the first phase of the clock signal and a logic low during the second phase of the clock signal.

15. The method as recited in claim 10, wherein said performing, said latching, and said storing is performed in each of a plurality of master stages of a master-slave flip-flop, wherein each of the plurality of input stages is one of the plurality of master stages.

16. The method as recited in claim 15, wherein said logically combining is performed in a slave stage of the master-slave flip-flop, wherein the output stage is the slave stage.

17. A flip-flop comprising:
   first means for precharging a first node and a second node of each of a plurality of input stages of the flip-flop during a first phase of a clock signal;
   second means for performing a plurality of logic functions on corresponding groups of input signals, wherein performing the plurality of logic functions includes discharging one of the first or second nodes of each of the plurality of input stages during a second phase of the clock signal;
   third means for storing results obtained from said performing a plurality of logic functions;
   fourth means for logically combining, during the second phase of the clock signal, the results of the plurality of logic functions to produce an output signal; and
   fifth means for latching the results of the plurality of logic functions from said third means to said fourth means.

18. The flip-flop as recited in claim 17, wherein each group of input signals includes two or more signals.

19. The flip-flop as recited in claim 17, wherein the plurality of logic functions includes one or more of the following logic functions: AND, OR, NAND, NOR, XOR, XNOR, Invert, non-inverting buffer.

20. The flip-flop as recited in claim 17, wherein said logically combining is performed by performing one or more of the following logic functions: AND, OR, NAND, NOR, XOR, XNOR, Invert, non-inverting buffer.

* * * * *